(12) United States Patent
Posseme et al.

(10) Patent No.: US 9,070,709 B2
(45) Date of Patent: Jun. 30, 2015

(54) METHOD FOR PRODUCING A FIELD EFFECT TRANSISTOR WITH IMPLANTATION THROUGH THE SPACERS

(75) Inventors: Nicolas Posseme, Carantec (FR); Laurent Grenouillet, Rives (FR); Yannick Le Tiec, Crolles (FR); Nicolas Loubet, Guilderland, NY (US); Maud Vinet, Rives (FR)

(73) Assignees: COMMISSARIAT A L'ENERGIE ATOMIQUE ET AUX ENERGIES ALTERNATIVES, Paris (FR); STMICROELECTRONICS, INC., Coppell, TX (US)

(*) Notice: Subject to any disclaimer, the term of this patent is extended or adjusted under 35 U.S.C. 154(b) by 0 days.

(21) Appl. No.: 14/119,395

(22) PCT Filed: Jun. 9, 2011

(86) PCT No.: PCT/US2011/039774
§ 371 (c)(1),
(2), (4) Date: Nov. 21, 2013

(87) PCT Pub. No.: WO2012/170027
PCT Pub. Date: Dec. 13, 2012

(65) Prior Publication Data
US 2014/0087524 A1    Mar. 27, 2014

(51) Int. Cl.
*H01L 29/66* (2006.01)
*H01L 21/8234* (2006.01)
*H01L 21/84* (2006.01)
*H01L 21/265* (2006.01)

(52) U.S. Cl.
CPC .. *H01L 29/66477* (2013.01); *H01L 21/823418* (2013.01); *H01L 21/84* (2013.01); *H01L 21/2652* (2013.01); *H01L 21/26586* (2013.01); *H01L 29/66545* (2013.01); *H01L 29/66628* (2013.01); *H01L 29/66772* (2013.01)

(58) Field of Classification Search
None
See application file for complete search history.

(56) References Cited

U.S. PATENT DOCUMENTS

| 4,829,356 A | 5/1989 | Arndt |
| 5,411,899 A | 5/1995 | Lee et al. |

(Continued)

FOREIGN PATENT DOCUMENTS

| EP | 1 294 026 A2 | 3/2003 |
| WO | WO 01/22487 A1 | 3/2001 |

OTHER PUBLICATIONS

Yasuhiro Sato et al., "Influence of Doping Gradient near a Channel End on Parasitic Series Resistance of Thin-Film Fully-Depleted Metal-Oxide-Semiconductor Field-Effect Transistors," Japanese Journal of Applied Physics, vol. 43, No. 10, 2004, pp. 6948-6956.

(Continued)

*Primary Examiner* — Charles Garber
*Assistant Examiner* — Alia Sabur
(74) *Attorney, Agent, or Firm* — Oliff PLC

(57) ABSTRACT

The substrate successively includes a support substrate, an electrically insulating layer, a semiconductor material layer, and a gate pattern. The semiconductor material layer and gate pattern are covered by a covering layer. A first doping impurity is implanted in the semiconductor material layer through the covering layer so as to place the thickness of maximum concentration of the first doping impurity in the first layer. The covering layer is partly eliminated so as to form lateral spacers leaving source/drain electrodes free.

15 Claims, 2 Drawing Sheets

(56) References Cited

U.S. PATENT DOCUMENTS

| | | | |
|---|---|---|---|
| 5,960,322 | A | 9/1999 | Xiang et al. |
| 6,391,733 | B1 * | 5/2002 | Fisher ............................ 438/305 |
| 7,022,577 | B2 * | 4/2006 | Meyyappan .................. 438/307 |
| 7,144,786 | B2 | 12/2006 | van Bentum et al. |
| 2005/0009348 | A1 | 1/2005 | Ghyselen et al. |
| 2005/0095796 | A1 * | 5/2005 | van Bentum et al. ......... 438/300 |
| 2005/0255660 | A1 | 11/2005 | Lin et al. |

OTHER PUBLICATIONS

C. Fenouillet-Beranger et al., "Impact of a 10 nm ultra-thin Box (UTBOX) and ground plane on FDSO1 devices for 32 nm node and below," Solid State Electronics, 54, 2010, pp. 849-854.

Oct. 10, 2014 European Search Report issued in European Application No. 11867399.5.

* cited by examiner

METHOD FOR PRODUCING A FIELD EFFECT TRANSISTOR WITH IMPLANTATION THROUGH THE SPACERS

BACKGROUND OF THE INVENTION

The invention relates to a method for producing a field effect transistor on a substrate of semiconductor on insulator type.

STATE OF THE ART

With the continuous reduction of their size, active integrated circuit devices such as transistors are confronted with increasingly present stray physical phenomena on their main electric characteristics, for example short-channel effect. In order to remedy a certain number of these drawbacks, different solutions are envisaged.

The substrates on which the transistors are integrated have been modified in order to reduce certain of the stray physical phenomena of transistors. These improved substrates are of semiconductor-on-insulator type. They are formed by a layer of semiconductor material separated from the support substrate by a dielectric material. The field effect transistor is integrated on the semiconductor material layer. Depending on the thickness of the semi-conductor material layer, the substrate is said to be partially or fully depleted.

By successively using substrates of partially depleted then fully depleted semiconductor-on-insulator type, it has been possible to continue the race towards miniaturization and continuous improvement of transistors.

The silicon thickness of substrates of fully depleted semiconductor-on-insulator type has continuously decreased over the generations in order to improve the electric performances of the transistor. However, this reduction of thickness gives rise to a number of fabrication problems. The smaller the silicon thickness, the more the fabrication methods have to preserve this thin layer. Variations of thickness result in increasingly marked differences of behavior between the devices.

In conventional manner, a gate electrode is formed on a substrate of semiconductor-on-insulator type provided with a support substrate, a silicon oxide layer and the silicon film. Lateral spacers are then formed on the side walls of the gate electrode and implantation is then performed directly in the silicon film to form the doped source/drain electrodes. Implantation is performed in such a way as to place the maximum of dopants in the silicon without however going as far as rendering the layer amorphous. The contacts are then formed on the electrodes.

The ever-continuing reduction of the thickness of the silicon-on-insulator layer requires the ion implantation energy to be continuously reduced. It is however difficult to achieved a reproducible method below a minimum energy level. It is observed that, in an integrated circuit, the devices obtained present very large disparities of operation from one to the other.

OBJECT OF THE INVENTION

It is observed that a need exists to provide a fabrication method of transistors on insulator presenting thin films that is more reproducible and that is easy to implement.

This problem tends to be solved by means of a method that comprises the following steps:

providing a substrate successively comprising a support substrate, an electrically insulating layer, a semiconductor material layer, and a gate pattern, covering the semiconductor material layer and the gate pattern by a covering layer, implanting a first doping impurity in the semiconductor material layer through the covering layer so as to place the thickness with the maximum concentration of first doping impurity in the first layer, eliminating partially the covering layer so as to form lateral spacers leaving source/drain electrodes free.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
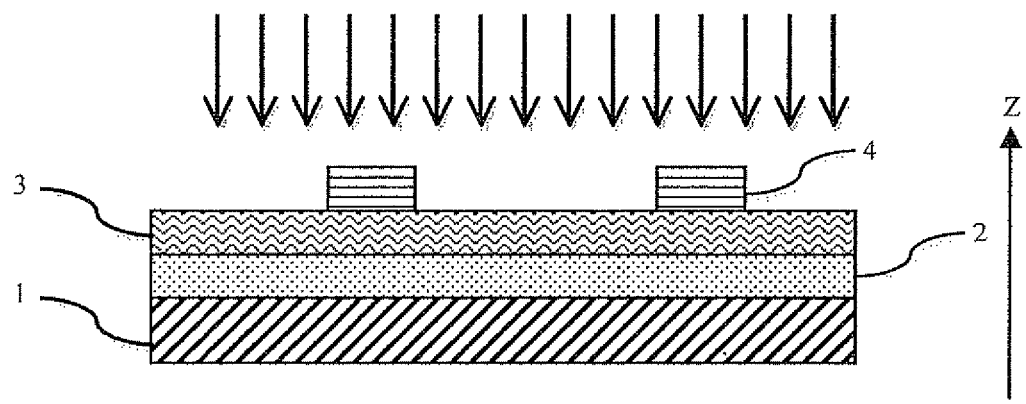
FIG. 1 represents a step of performing a doping method, in schematic manner in cross-sectional view.

As illustrated in FIG. 1, an implantation step is performed on a substrate. The substrate successively comprises a support substrate 1 made from a first material and a first layer 2. The first layer represents the layer to be doped 2 and it is made from a second material different from the first material at the level of the interface. The support substrate can comprise several different materials, but the material of the first layer is different from the material of the support substrate at the level of the common contact.

Layer to be doped 2 is covered by a covering layer 3. Covering layer 3 is separated from support substrate 1 by layer to be doped 2. The material of layer to be doped 2 is different from that of support substrate 1 and from that of covering layer 3 in order to achieve etching selectivity if required. The crystal structures are different between two consecutive materials either in the type of crystal lattice or in the structure of the materials present (single-crystal, polycrystal, amorphous).

The implantation step performed on the substrate enables a first doping impurity to be introduced into one or more layers of the substrate. The first doping impurity is sent to layer to be doped 2 through covering layer 3. Implantation of the first doping impurity in layer to be doped 2, through covering layer 3, modifies the concentration profile in the substrate and more particularly in layer to be doped 2 in comparison with implantation without covering layer 3.

In conventional manner, the implantation conditions are imposed both by the technical performances of implantation equipment and by the quantity of dopants and the dopant profile sought for in layer to be doped 2. The implantation energy defines the depth and profile of the dopants. The implantation conditions are chosen such as to place a desired concentration of the first doping impurity at a precise thickness of the substrate.

Figure 2:
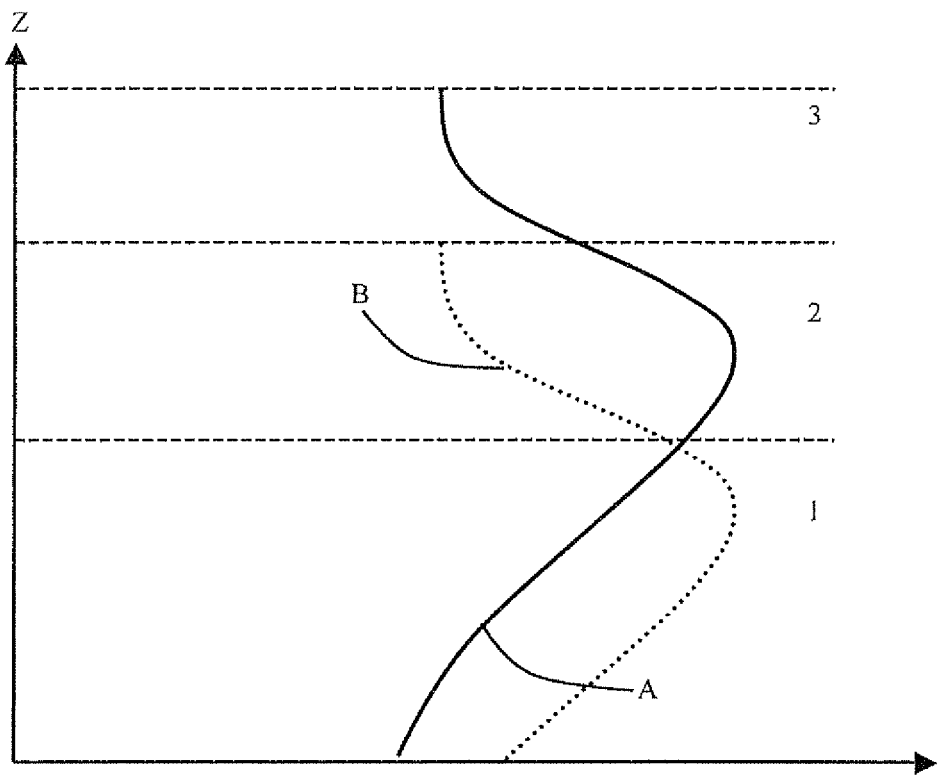
FIG. 2 represents the doping profile in the substrate with and without a covering layer, in schematic manner.

As represented in FIG. 2, when implantation is performed, the doping impurity concentration follows a predefined profile the maximum dopant concentration of which is located at depth Rp. This depth is also called mean implantation depth Rp and it is defined by the implantation energy and by the stopping power of the materials passed through. The distribution of dopants along the Z-axis can be assimilated to a Gaussian with a maximum concentration located at depth Rp. Plot A illustrates the doping profile of the first doping impurity in the substrate with covering layer 3. Plot B illustrates the doping profile without covering layer 3, the implantation conditions being identical. Although the same quantity of dopants is sent in the direction of the substrate, a smaller quantity of dopants is incorporated in layer 2 in the case of plot B in comparison with what is observed with plot A.

The quantity of ions implanted in the substrate is a function of implantation time.

Under these conditions, the thinner layer to be doped 2, the lower the energy used has to be. However, the technical performances of equipment do not make it possible to work below a limit energy which imposes a minimum value of depth Rp able to be attained by a piece of equipment. In other words when layer to be doped 2 is too thin, the implantation step dopes support substrate 1 instead of layer to be doped 2. It is then no longer possible to have high doping of layer to be doped 2 without increasing the implantation time and risking rendering layer 2 amorphous. If layer 2 is rendered amorphous, its crystal information will be lost and its electric performances will be largely impaired.

When the technical capacities of the implantation equipment do not enable the maximum dopant concentration to be placed at the desired depth, it is interesting to cover layer to be doped 2 by covering layer 3 in order to shift the maximum dopant concentration position with respect to layer 2. The method enables efficient doping of layer 2 located at the surface of the substrate to be ensured although the minimum mean implantation depth Rp authorized by the equipment is greater than the thickness of layer 2.

In preferential manner, mean implantation depth Rp is placed within layer to be doped 2, in even more preferential manner in the middle of layer to be doped 2. In this way, the maximum concentration is located in layer to be doped 2 which enables the period of the implantation step to be reduced for a given quantity of dopants, thereby reducing the risk of layer to be doped 2 being rendered amorphous.

Placing mean implantation depth Rp in the center of the layer to be doped (along the Z-axis) or in immediate proximity to the center of layer 2 makes the doping method more robust. A small variation of the thickness of layer to be doped 2 and/or of covering layer 3 hardly modifies the quantity of first impurity incorporated per surface unit.

In other words, to facilitate the implantation step in the film to be doped 2, the latter is artificially thickened by means of covering layer 3. A part of the implanted dopants is lost as it is located in covering layer 3, but the final quantity of dopants incorporated in layer to be doped 2 is greater or substantially identical in comparison with implantation without covering layer 3.

This approach is all the more interesting as the thickness of film to be doped 2 is thin compared with the minimum dopant profile (the minimum value of Rp) that the implantation equipment is able to supply. The method enables the implantation step to be made less sensitive to variations of thickness.

Whereas the underlying idea is to seek to reduce the implantation energy to introduce a maximum of dopants into thin layer 2, in the present case an additional layer 3 is introduced in the implantation step to displace the maximum of the quantity of dopants into the volume of film to be doped 2. The technical limitations of the implantation equipment are partly compensated by the use of a covering layer 3 which can be sacrificial.

In a particular embodiment illustrated in FIG. 1, covering layer 3 is partially covered by one or more patterns 4 made from masking material which prevent the first doping impurity from reaching layer to be doped 2. This masking of the surface of covering layer 3 enables doped areas to be formed next to non-doped areas. The masking material is for example a photoresist, but other materials are conceivable such as a dielectric or polycrystal material. Pattern 4 can be made before depositing covering layer 3 or there again after covering layer 3 has been formed.

In preferential manner, covering layer 3 is then completely or partially eliminated in order to have access to layer to be doped 2. Depending on the embodiments used, covering layer 3 can be thinned or it can be etched to free access to one or more areas of layer to be doped 2. In other cases, layer 2 can be completely eliminated. It is also possible to have total elimination in certain places, thinning in others and total conservation of the layer in other predefined areas.

Covering layer 3 can be formed by a layer made from a predefined material having a composition that is constant or variable over its thickness. It is also conceivable to have a covering layer 3 that is formed by a stack of several different materials.

Figure 3:
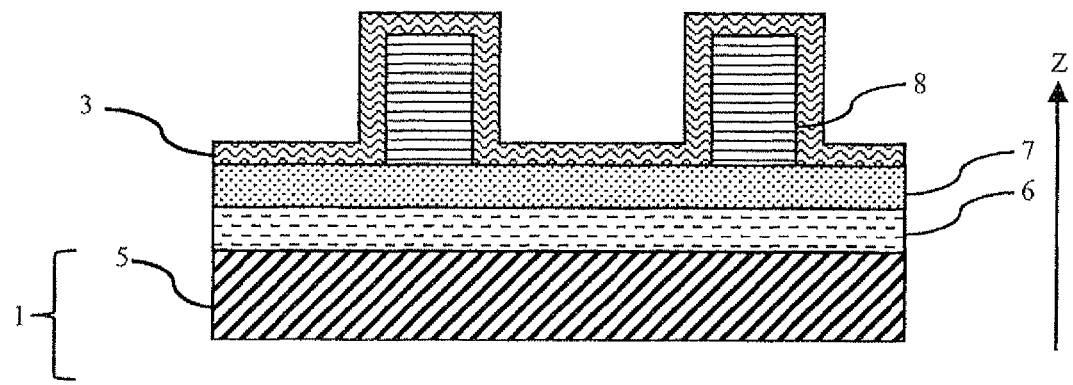
FIGS. 3 and 4 represent a particular embodiment of a field effect device, in schematic manner in cross-sectional view.

In a particular exemplary embodiment illustrated in FIG. 3, the method is used to dope the source/drain electrodes of a field effect transistor integrated on a substrate of semiconductor-on-insulator type.

As illustrated in FIG. 3, a substrate of semiconductor-on-insulator type successively comprises a support substrate 5, an electrically insulating layer 6 and a semiconductor material film 7. Semiconductor material film 7 is a layer called active layer as it is designed to integrate one or more field effect transistors or other devices. Electrically insulating layer 6 is an electrically insulating material, for example an amorphous material such as a silicon oxide, a silicon nitride, a mixture or a stack of the latter. Semi-conductor material film 7 is a single-crystal material that comprises the source and drain electrodes of the transistor and the conduction channel. Support substrate 5 can comprise a semiconductor material film that is in contact with electrically insulating layer 6 to form for example a counter-electrode.

A gate pattern 8 is formed on semiconductor material film 7. Gate pattern 8 can be a gate electrode that is formed on semiconductor material film 7. The gate electrode is then separated from semiconductor material film 7 by a gate dielectric (not shown). Gate pattern 8 can further be a sacrificial pattern that delineates the position and surface of a future gate electrode.

The substrate then successively comprises support substrate 5, electrically insulating layer 6, semiconductor material film 7, gate dielectric (if applicable) and gate pattern 8.

Figure 4:
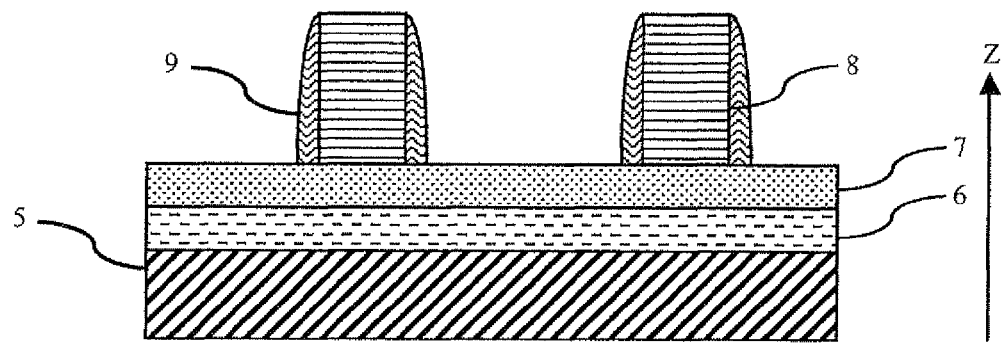

As illustrated in FIGS. 3 and 4, a covering layer 3 is deposited on gate pattern 8 and on semiconductor material film 7.

In a particular embodiment illustrated in FIG. 3, covering layer 3 is made from an electrically insulating material, for example a silicon oxide, a silicon nitride or a stack of several insulating layers. Covering layer 3 is designed to form the future lateral spacers 9 of the field effect transistor.

Substrate 1 undergoes an ion implantation step, for example tilted implantation, of a first doping impurity. This ion implantation enables the source/drain electrodes to be formed by doping of semiconductor material film 7. In this way, the source/drain electrodes are self-aligned with respect to gate pattern 8 and it is possible to control the lateral implantation depth of the dopants underneath spacers 9 and/or underneath gate pattern 8.

For example purposes, if the first doping impurity is arsenic or phosphorus, the source/drain electrodes are N-type. If on the contrary the first doping impurity is boron or indium, the source/drain electrodes are P-type.

The implanted ions pass through covering layer 3 to form the source/drain electrodes enabling the doping profile to be displaced to semiconductor film 7. Covering layer 3 modifies the doping profile by incorporating a part of the implanted ions and by displacing the position of the maximum of dopants in the substrate. In this way, a larger quantity of ions is incorporated in semi-conductor film 7 enabling a larger concentration of dopants to be had in the source/drain electrodes. Implantation can be performed in vertical or tilted manner.

In this way, without modifying the implantation conditions or risking rendering semiconductor material film 7 amorphous, source/drain electrodes can be obtained that are more doped than in the prior art.

Covering layer 3 is then etched in anisotropic manner to form lateral spacers 9 on the side walls of gate pattern 8 and to uncover at least a part of the surface of the source and drain areas. In this case, covering layer 3 serves the purpose, in a first stage, of displacing the position of depth Rp in the substrate, and then in a second stage of forming lateral spacers 9, which reduces the number of deposited materials and eliminates superfluous technological steps to obtain a field effect transistor. The quantity of semiconductor material eliminated during the method is thereby reduced.

In a particular embodiment, covering layer 3 is covered by an additional layer deposited after the implantation step. Covering layer 3 and additional layer are etched to form lateral spacers 9.

This embodiment is particularly interesting when the thickness of semi-conductor material film 7 is smaller than or equal to 8 nm, as implantation equipment is unsuitable for providing a reproducible method for doping source/drain electrodes by implantation.

Covering layer 3 also enables the quantity of dopants to be incorporated and therefore the thickness of material rendered amorphous to be reduced, facilitating fabrication of raised source/drain electrodes by means of selective epitaxy.

In a preferred embodiment, implantation is performed with an energy comprised between $10^3$ and $3*10^3$ eV with a dose comprised between $2*10^{14}$ and $3*10^{15}$ cm$^{-2}$ to perform P-type or N-type doping of a substrate having a semiconductor film 7 with a thickness of less than 6 nm covered by a covering layer 3 having a thickness comprised between 1 and 5 nm.

It has further been discovered that for a covering layer 3 composed of silicon nitride with a density equal to 2.9 g·cm$^{-3}$ and having a thickness comprised between 1 and 3 nm, the quantity of dopant incorporated is substantially constant when the thickness of semiconductor material film 4 is less than 6 nm. In preferential manner, the thickness of covering film 3 is comprised between 1 and 3 nm, and the variations are about 20%. In even more preferential manner, the thickness of the covering layer is equal to 2 nm, and the variation of the quantity of dopants incorporated is about 5% for a covering layer varying between 3 and 5 nm. In this case, implantation is performed for arsenic with implantation at 1 keV and a dose of $1*10^{15}$ cm$^{-2}$.

It is also possible to obtain a similar result by means of implantation of arsenic with a covering layer made from silicon nitride or silicon oxide if the implantation energy is comprised between 1 and 3 keV with an implanted dose comprised between $2*10^{14}$ and $3*10^{15}$ cm$^{-2}$.

A similar result was also observed for a covering layer made from hafnium oxide (HfO$_2$) the density of which is equal to 9.8 g·cm$^{-3}$ and for a covering layer made from silicon oxide the density of which is equal to 2.27 g·cm$^{-3}$. However, the implantation conditions and/or the thickness of the covering layer have to be modified slightly to obtain the required result.

For example purposes, for a covering layer 3 composed of hafnium oxide and having a thickness comprised between 0.5 and 1.8 nm, the quantity of dopant incorporated is substantially constant when the thickness of semi-conductor material film 4 is less than 3 nm. In this case, implantation is performed for arsenic with implantation at 1 keV and a dose of $1.5*10^{15}$ cm$^{-2}$.

For a covering layer 3 composed of silicon oxide and having a thickness comprised between 0.5 and 3 nm, the quantity of dopant incorporated is substantially constant when the thickness of semiconductor material film 4 is comprised between 4 and 6 nm. In preferential manner, the thickness of covering film 4 is comprised between 1 and 2 nm, and the variations are almost nil. In this case, implantation is performed for arsenic with implantation at 1 keV and a dose of $1.5*10^{15}$ cm$^{-2}$.

In even more preferential manner, the thickness of the covering layer is equal to 2 nm, and the variation of the quantity of incorporated dopants is about 5% to 10% for a semiconductor material film 4 varying between 3 and 5 nm.

Similar results were observed with implantation of phosphorus or boron (with BF2) through a layer of silicon nitride or oxide comprised between 1 and 6 nm, with an implantation energy comprised between 1 and 3 keV and an implantation dose comprised between $2*10^{14}$ and $3*10^{15}$·cm$^{-2}$. There again, depending on the nature of the material of the covering layer and the thickness of the layer to be doped, it is possible to find an implantation condition with which a small variation of the thickness of the covering layer and/or of the film to be doped has a reduced effect on the quantity of dopants incorporated per surface unit.

Other materials can be envisaged such as a material having a lower dielectric constant than that of silicon oxide to form the spacers.

In a particular embodiment, a single-crystal material is deposited selectively, after implantation, on the source and drain areas of the transistor. The single-crystal material enables the source and drain areas to be thickened without modifying the thickness of the channel. It is thereby easier to perform silicidation of the source and drain areas. Without the covering layer, a single-crystal material cannot be deposited, as the crystallographic quality of the semiconductor material layer is not sufficient.

The invention claimed is:

1. A method for producing a field effect transistor comprising successively:
    providing a substrate successively comprising a support substrate, an electrically insulating layer, a semiconductor material layer, and a gate pattern,
    covering the semiconductor material layer and the gate pattern by a covering layer,
    implanting a first doping impurity in the semiconductor material layer through the covering layer so as to place a maximum concentration of implanted first doping impurity at a first implantation depth in the semiconductor material layer, and
    partly eliminating the covering layer so as to form lateral spacers leaving source/drain electrodes free,
    wherein a thickness of the semi-conductor material layer is smaller than the first implantation depth.

2. The method according to claim 1, wherein implantation is performed in an implantation equipment having a larger first implantation depth than the thickness of the semiconductor material layer.

3. The method according to claim 1, wherein the mean implantation depth of the first doping impurity is located in a middle of the semiconductor material layer.

4. The method according to claim 1, wherein the thickness of the semi-conductor material layer is smaller than or equal to 8 nm.

5. The method according to claim 1, comprising selective deposition of a single-crystal material on the source and drain areas.

6. A method for producing a field effect transistor comprising successively:
   providing a substrate successively comprising a support substrate, an electrically insulating layer, a semiconductor material layer, and a gate pattern,
   covering the semiconductor material layer and the gate pattern by a covering layer,
   implanting a first doping impurity in the semiconductor material layer through the covering layer so as to place a maximum concentration of implanted first doping impurity at a first implantation depth in the semiconductor material layer, and
   partly eliminating the covering layer so as to form lateral spacers leaving source/drain electrodes free,
   wherein implantation is performed in an implantation equipment having a larger first implantation depth than the thickness of the semiconductor material layer.

7. A method of producing a field effect transistor comprising:
   forming a gate electrode structure on an SOI substrate,
      wherein the SOI substrate includes a support substrate, an insulating layer on the support substrate, and a semiconductor layer on the insulating layer,
      wherein the semiconductor layer includes a channel region under the gate electrode structure, source/drain regions adjacent the channel region,
      wherein the channel region and the source/drain regions of the semiconductor layer have a thickness of smaller than or equal to 8 nm, and
      wherein at least the channel region of the semiconductor layer is fully-depleted silicon and has a single-crystal structure;
   forming a covering layer over the gate electrode structure and the SOI substrate;
   implanting a first dopant impurity in the source/drain regions of the semiconductor layer through the covering layer so as to place a maximum concentration of the implanted first dopant impurity at a first implantation depth from a top surface of the covering layer and located within the source/drain regions of the semiconductor layer,
      wherein the thickness of the semiconductor layer is smaller than the first implantation depth;
   removing the covering layer at least from a portion of the source/drain regions of the semiconductor layer.

8. The method according to claim 7, wherein the covering layer is an insulating material.

9. The method according to claim 7, wherein material properties of the covering layer and the semiconductor layer are different so that the removing of the covering layer may be achieved with a selective etch.

10. The method according to claim 7, wherein a thickness of the covering layer is selected based upon a material composition of the covering layer and based upon implantation energy for the implanting of the first dopant impurity, so that the first implantation depth will be located within a middle region of the source/drain regions of the semiconductor layer.

11. The method according to claim 7, wherein the implanting of the first dopant impurity does not convert the source/drain regions of the semiconductor layer from a single-crystal structure to an amorphous layer.

12. The method according to claim 7, wherein the implanting of the first dopant impurity is performed in an implantation equipment having a larger first implantation depth than the thickness of the semiconductor layer at the source/drain regions.

13. The method according to claim 7, wherein the covering layer is a sacrificial layer that is completely removed after the implanting of the first dopant impurity.

14. The method according to claim 7, wherein the covering layer includes a stack of a plurality of layers of different materials.

15. The method according to claim 7, wherein portions of the covering layer remain on the gate electrode structure forming a spacer structure.

* * * * *